United States Patent
Rumsey

(10) Patent No.: US 6,634,099 B2
(45) Date of Patent: Oct. 21, 2003

(54) SOLDERMASK OPENING TO PREVENT DELAMINATION

(75) Inventor: Brad D. Rumsey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 09/854,073

(22) Filed: May 11, 2001

(65) Prior Publication Data

US 2001/0017768 A1 Aug. 30, 2001

Related U.S. Application Data

(62) Division of application No. 09/417,491, filed on Oct. 13, 1999.

(51) Int. Cl.⁷ ................................................. H05K 3/34
(52) U.S. Cl. ......................... 29/840; 830/843; 830/852
(58) Field of Search ........................... 29/840, 852, 843, 29/825, 830, 842, 839

(56) References Cited

U.S. PATENT DOCUMENTS

| | | | |
|---|---|---|---|
| 4,801,069 A | 1/1989 | Ankrom et al. | 228/180.2 |
| 4,840,305 A | 6/1989 | Ankrom et al. | 228/232 |
| 4,847,446 A | 7/1989 | King et al. | 174/68.5 |
| 4,912,020 A * | 3/1990 | King et al. | |
| 5,214,845 A | 6/1993 | King et al. | 29/841 |
| 5,519,580 A | 5/1996 | Natarajan et al. | 361/760 |
| 5,593,080 A * | 1/1997 | Teshima et al. | |
| 5,617,990 A | 4/1997 | Thompson, Sr. | 228/180.1 |
| 5,704,535 A | 1/1998 | Thompson, Sr. | 228/39 |
| 5,724,720 A | 3/1998 | Tuttle | 29/623.5 |
| 5,739,585 A | 4/1998 | Akram et al. | 257/698 |
| 5,759,737 A * | 6/1998 | Feilchenfeld et al. | |
| 5,776,824 A * | 7/1998 | Farnworth et al. | |
| 5,796,590 A | 8/1998 | Klein | 361/774 |
| 5,851,899 A * | 12/1998 | Weigand | |
| 5,852,870 A | 12/1998 | Freyman et al. | 29/841 |
| 5,872,338 A | 2/1999 | Lan et al. | 174/255 |
| 5,900,273 A | 5/1999 | Rasmussen et al. | 427/58 |
| 5,915,749 A | 6/1999 | Baldwin | 29/593 |
| 5,930,889 A * | 8/1999 | Klein | |
| 5,945,729 A | 8/1999 | Stroupe | 257/666 |
| 5,949,141 A * | 9/1999 | Farnworth et al. | |
| 5,981,314 A | 11/1999 | Glenn et al. | 438/127 |
| 6,069,028 A | 5/2000 | Stroupe | 438/123 |
| 6,084,297 A | 7/2000 | Brooks et al. | 257/698 |
| 6,085,962 A | 7/2000 | Jacobsen et al. | 228/103 |
| 6,124,637 A | 9/2000 | Freyman et al. | 257/736 |
| 6,150,193 A | 11/2000 | Glenn | 438/113 |
| 6,378,199 B1 * | 4/2002 | Yoshinuma et al. | |

* cited by examiner

Primary Examiner—Carl J. Arbes
(74) Attorney, Agent, or Firm—Schwegman, Lundberg, Woessner & Kluth, P.A.

(57) ABSTRACT

A multilayer circuit board includes a base layer, a conductive layer and a soldermask. The soldermask layer has two sets of openings. One of the openings are vent openings, that expose the base layer to provide ventilation so that gases may escape during processing. The second openings expose selective regions of a conductor layer. The multi-layer circuit board provides for less occurrences of delamination.

34 Claims, 3 Drawing Sheets

SOLDERMASK OPENING TO PREVENT DELAMINATION

This application is a division of application Ser. No. 09/417,491 filed Oct. 13, 1999.

TECHNICAL FIELD OF THE INVENTION

The present invention relates generally to printed circuit boards production and, in particular, to the processes utilized to create printed circuit boards.

BACKGROUND OF THE INVENTION

A typical printed circuit board is a flat board that provides support and electrical interconnection between microchips and other electronic components. The base of the board can be made of reinforced fiberglass or plastic, and the electronic components are electrically interconnected by conductive pathways. There are several ways to make printed circuit boards. One method entails bonding a conductive foil, such as copper, over the base. A conductive pattern is then formed in the conductor. One method of patterning the metal layer uses a negative image of the desired circuit pattern and a photo resist layer. The photo resist is activated using the image such that selected areas of the photo resist can be removed. An etch process is then performed to remove the photo resist that was not activated and the underlying metal layer, leaving behind the conductive pathway pattern.

Today, most printed circuit boards are composed of several sheets or layers. A multi-layer printed circuit board may be fabricated from several composite sheets, each comprising a substrate of insulating material and a layer of metal, such as copper, attached to one surface of the substrate using a resin. A desired conductive pathway pattern is then provided in the metal layer, as explained, and multiple layers of insulating material and metal conductor layers can be fabricated. A soldermask layer can be provided over the top level of conductor to control areas exposed to a soldering process. A finished printed circuit board can then put through an assembly process where it is populated with various electrical components.

Delamination, or separation, problems have been discovered in the printed circuit board assembly industry regarding processes similar to the one described above. These problems are a result of the various environmental stresses inherent to assembly procedures. For example, delamination of the soldermask layer can occur when moisture retained by a board's constituent components are exposed to post-production assembly processes performed at high temperatures.

For the reasons stated above, and for other reasons stated below which will become apparent to those skilled in the art upon reading and understanding the present specification, there is a need for a multi-layer printed circuit board assembly that reduces the likelihood of delamination.

SUMMARY OF THE INVENTION

The above mentioned problems with circuit board assemblies and other problems are addressed by the present invention and which will be understood by reading and studying the following specification.

In one embodiment, a circuit board comprises a base layer, and a conductive layer located on a first side of the base layer. The conductive layer is patterned into conductive traces. A soldermask layer is located on a surface of the conductive layer and a region of the first side of the base layer which is not covered by the conductive layer. The soldermask layer is provided with a first plurality of openings to expose the base layer to provide ventilation, and wherein the soldermask layer is further provided with a second plurality of openings to expose the conductive traces.

In another embodiment, a circuit board assembly comprises a base layer, and a conductive layer located on top of the base layer. The conductive layer is patterned to form conductive traces. A soldermask is attached over the conductor layer and the base layer. The soldermask layer includes a first plurality of openings to expose a top surface of the base layer and a second plurality of openings to expose areas of the conductors. An integrated circuit is also attached to a first side of the circuit board.

DETAILED DESCRIPTION OF THE INVENTION

Figure 1:
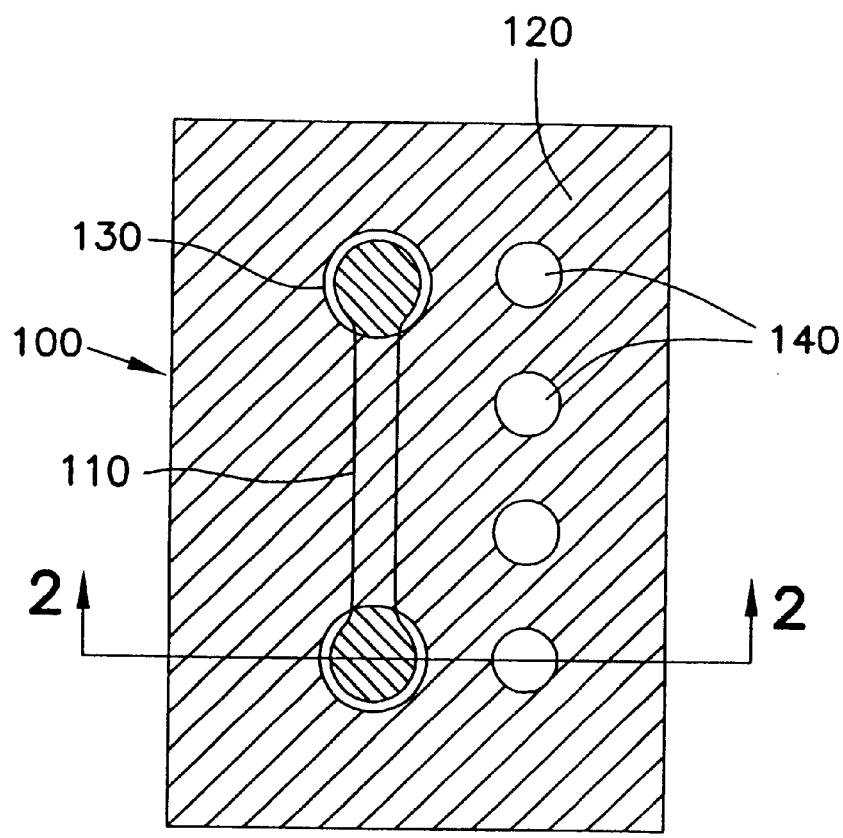
FIG. 1 is a top view of one embodiment of a simplified circuit board according to the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Printed circuit boards, as described above, can be fabricated using multiple layers of different materials. These materials can be insulators, conductors or other materials used to provide benefits during processing such as soldermasks. Because these materials differ in composition, they behave differently to environmental conditions such as temperature and humidity. Of particular interest to the present invention is the retention of water, or other liquids, by insulating material used in fabrication of circuit boards.

Soldermasks, as known to those skilled in the art, are used to mask areas of a conductor to prevent solder from coating the conductor. That is, some areas of the conductor may be required to be coated in solder, while other areas need to be protected from solder. By controlling the location of solder, conductive shorts can be prevented.

The soldermask layer can be screen printed over the conductor. The soldermask includes openings to expose selected areas of the conductor. It is desired that the soldermask remain adhered during processing. If the soldermask layer delaminates from the conductor, conductive shorts or leakage paths can be formed.

The present invention provides a technique for reducing delamination of a soldermask layer of a circuit board which results from out-gassing of layers of the circuit board. FIG. 1 is a top view of a simplified circuit board 100 according to the present invention. The circuit board includes a conductor trace 110 and a soldermask used to shield the conductive layer from potential shorts by exposing only selected areas of the conductor via conductor openings 130. The soldermask also includes ventilation openings 140 to allow underlying layers of the circuit board to vent gases during processing without producing adverse side effects to the adhesion of the soldermask. The details of the vent openings, or holes, are described in greater detail below.

Figure 2:
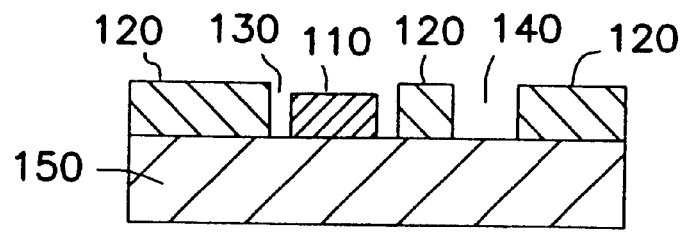
FIG. 2 is a cross section view of the circuit board shown in FIG. 1.

FIG. 2 illustrates a cross-section view of the circuit board of FIG. 1. The soldermask 120, or solder resist, allows access to the conductor 110 via conductor openings 130. Unlike prior soldermasks, the present invention provides an opening, vent holes 140 to expose a base layer 150. These openings allow for ventilation of the base layer. The base layer can be comprised of any electrically insulating material. In one embodiment, the base material is Mitsubishi HCL832. The base layer can be fabricated using multiple layers, and is not limited to a single material. The soldermask can be either a sheet of insulating material which is adhered to the top of the base layer and conductor or a conformal coating. In one embodiment, the soldermask is a sheet of Taiyo AUS5 which is adhered to the board using a screen printing operation. Likewise, the conductor traces can be any suitable conductive, or semi-conductive material such as copper.

As explained herein, the ventilation holes are provided in the soldermask layer to allow the base layer to out-gas. As such, the vent holes are located in a region of the circuit board which do not contain conductors. Because the soldermask in one embodiment is a sheet of material, the ventilation holes are patterned into a plurality of holes. That is, an array of holes is preferred to providing one large hole. The location and number of the ventilation holes will be dependant upon the design of the circuit board. In general, maximizing the cumulative surface area of ventilation holes in the locations not containing conductors is desired.

Figure 3:
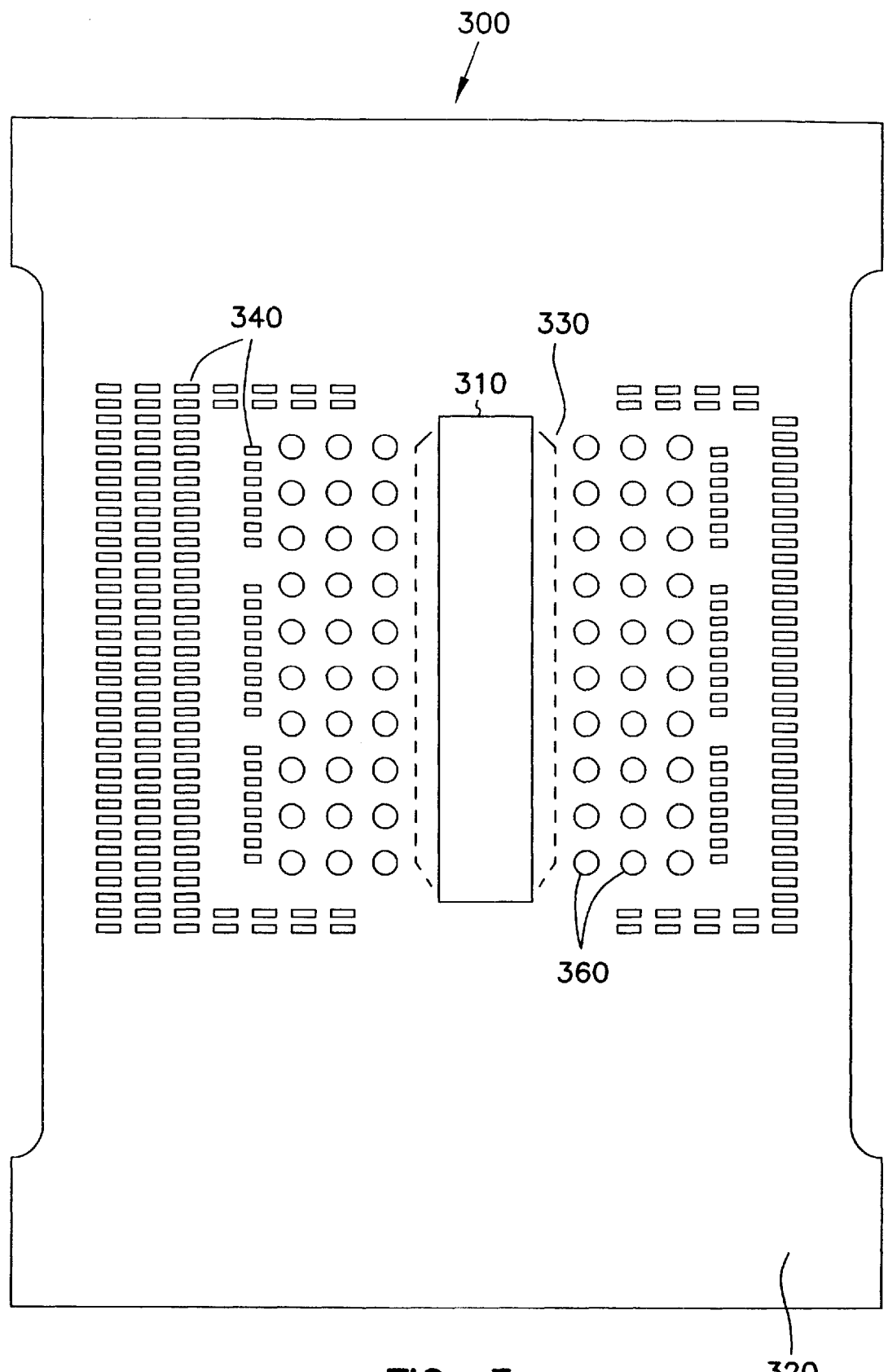
FIG. 3 is a top view of an embodiment of a detailed circuit board according to the present invention.
Figure 4:
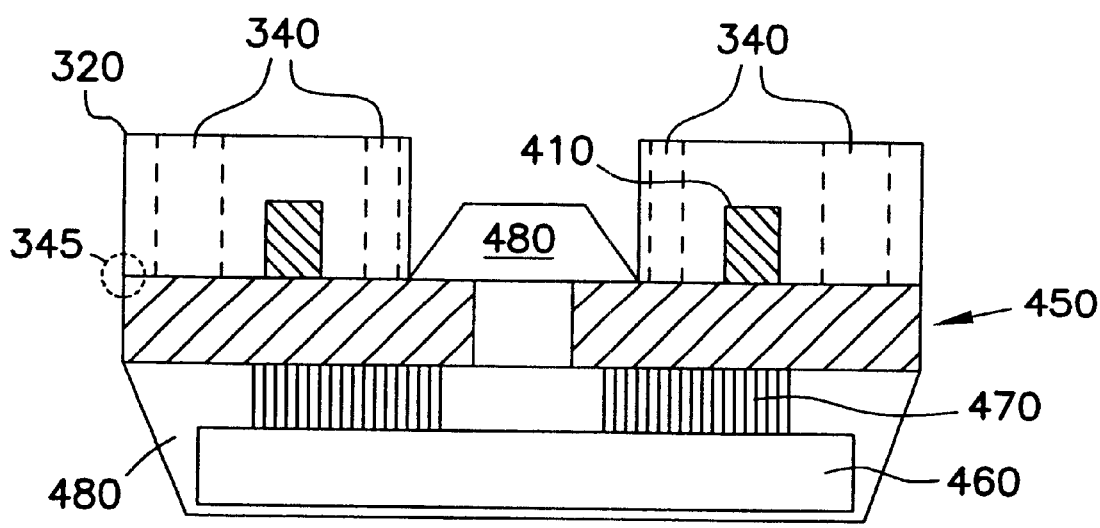
FIG. 4 is a cross section view of the circuit board shown in FIG. 3.

FIG. 3 provides a top view of another embodiment of a circuit board 300 according to the present invention, and FIG. 4 provides a cross-sectional view of the circuit board of FIG. 3. The circuit board includes a conductive grid array 360 for providing an interconnect for circuit components, such as but not limited to resistors, capacitors, inductors, and integrated circuits. The soldermask layer 320 includes first openings to provide access to the grid array conductors, and second opening 340 to expose the base layer. These openings are generally provided along outside edges of the circuits board.

An integrated circuit die assembly is fabricated using the circuit board 300, as illustrated in FIG. 4. The die assembly is comprised of the circuit board base layer 450 with a soldermask layer 320 concealing a conductive layer 410. A rectangular shaped opening, or aperture 310 is provided in the board. The opening passes through the soldermask layer, the conductive layer and the base layer. This opening provided access to an integrated circuit die, as explained below. A plurality of bond pads are located in regions 330 of the circuit board outside the aperture. A plurality of solder bump conductor openings 360 are located on the same side of the circuit board as the bond pads.

The die assembly comprises the integrated circuit die (IC) 460 which has its top side affixed to the bottom side of the circuit board. The IC can be affixed to the board with an adhesive 470. The adhesive is applied to the IC's top side such bond connections provided on it's top side are exposed and fully accessible through aperture 310 when attached to the base layer. The IC can then be wire bonded through the opening to the bond pads provided in locations 330. The IC die and wire bonds are then encapsulated with a non-conductive encapsulant 480 to provide an environmental seal.

Again, the soldermask layer included ventilation openings 340 to allow the underlying layers to expel gases without adversely affecting the adherence of the soldermask layer. This is of particular interest when moisture retained by a board's constituent components (e.g. a soldermask layer or a base layer) are exposed to high temperatures delamination may occur in regions of the circuit board.

CONCLUSION

The invention allows gases trapped between layers of a multi-layered printed circuit board to escape, in an effort to prevent delamination. A circuit board has been described which includes openings in a particular layer(s) of the multi-level printed circuit board. The present invention describes an improved multi-layer circuit board that is more resistant to delamination problems. An embodiment of a multi-layer circuit board according to the present invention comprises a base layer, a conductive layer and a soldermask. The soldermask layer has two primary sets of openings. One of these sets are the vent openings, or vent holes, that expose the base layer to provide ventilation so that gases may escape. The circumference, location and depth of the holes are dependent upon the nature of the application. This invention allows a plurality of layers, such as the soldermask layer, to be used in printed circuit board applications, while preventing delamination throughout the board's surface. The reduction in delamination offers the added benefit of allowing for improved handling of the circuit board, particularly during various processing stages.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, by creating an avenue for gases to escape, the soldermask will remain attached at the board's perimeter, leaving a flat surface to clamp onto at the end of the assembly process. This makes further processing to the printed circuit board possible.

What is claimed is:

1. A method of venting a circuit board, the method comprises:
   providing a base layer;
   providing a conductive layer to a top side of the base layer;
   providing a soldermask layer to a top second side of the conductive layer;
   establishing a preferred region of the soldermask to form a first plurality of openings;
   forming the first plurality of openings in the soldermask layer to expose only the base layer beneath the soldermask layer to provide ventilation; and
   providing a second plurality of openings in the soldermask layer to expose regions of the conductive layer.

2. The method of claim 1 wherein the soldermask layer is provided using a screen printing operation.

3. The method of claim 1, wherein providing the conductive layer includes forming the conductive layer of copper.

4. The method of claim 1, wherein forming the first plurality of openings includes forming the first plurality of openings in a region of the base layer that accumulates undesirable gases.

5. The method of claim 1, wherein forming the second plurality of openings includes forming the second plurality of openings to expose both the conductive layer and the base layer.

6. A method of venting a circuit board, the method comprises:
provviding a base layer;
providing a conductive layer to a top side of the base layer;
providing a soldermask layer to a top second side of the conductive layer;
establishing a preferred region of the soldermask to form a first plurality of openings;
forming the first plurality of openings in the soldermask layer to expose at least the base layer beneath the soldermask layer to provide ventilation; and
providing a second plurality of openings in the soldermask layer to expose regions of the conductive layer wherein providing the base layer includes providing a die access opening and attaching a die to the base layer adjacent the die access opening.

7. A method of forming a circuit board, comprising:
forming a conductive layer on a base;
laminating a soldermask to the base over the conductive layer;
forming a plurality of openings in the soldermask over a region of the base that is free of conductors; and
venting the region of the base through the plurality of openings so as to prevent delamination of the soldermask from the base layer during subsequent processing.

8. The method of claim 7, wherein forming the plurality of openings includes not adversely affecting adherence of the soldermask to the base.

9. The method of claim 7, wherein forming the plurality of openings includes forming a first plurality of openings to the region of the base and forming a second plurality of openings to the conductive layer.

10. The method of claim 7, wherein forming the second plurality of openings includes forming the second plurality of openings to both the conductive layer and the base.

11. A method of forming a circuit board, comprising:
forming a conductive layer on a base;
laminating a soldermask to the base over the conductive layer;
forming a plurality of openings in the soldermask over a region of the base that is free of conductors;
venting the region of the base through the plurality of openings so as to prevent delamination of the soldermask from the base layer during subsequent processing; and
attaching an integrated circuit to the base.

12. The method of claim 11, wherein forming the plurality of openings includes not adversely affecting adherence of the soldermask to the base.

13. The method of claim 11, wherein forming the plurality of openings includes forming a first plurality of openings to the region of the base and forming a second plurality of openings to the conductive layer.

14. The method of claim 11, wherein forming the second plurality of openings includes forming the second plurality of openings to both the conductive layer and the base.

15. A method of forming a circuit board, comprising:
forming a conductive layer on a first side of a base;
laminating a soldermask to the first side of the base over the conductive layer;
forming a plurality of openings in the soldermask over a region of the base that is free of conductors;
venting the region of the base through the plurality of openings so as to prevent delamination of the soldermask from the base layer during subsequent processing; and
attaching an integrated circuit to a second side of the base.

16. The method of claim 15, wherein forming the plurality of openings includes not adversely affecting adherence of the soldermask to the base.

17. The method of claim 15, wherein forming the plurality of openings includes forming a first plurality of openings to the region of the base and forming a second plurality of openings to the conductive layer.

18. The method of claim 15, wherein forming the second plurality of openings includes forming the second plurality of openings to both the conductive layer and the base.

19. A method of forming a circuit board, comprising:
forming a conductive layer on a first side of a base;
laminating a soldermask to the first side of the base over the conductive layer;
forming a plurality of openings in the soldermask over a region of the base that is free of conductors;
venting the region of the base through the plurality of openings so as to prevent delamination of the soldermask from the base layer during subsequent processing;
attaching an integrated circuit to a second side of the base;
mounting an electrical component over the soldermask; and
electrically connecting the electrical component to at least one conductive trace of the conductive layer.

20. The method of claim 19, wherein forming the plurality of openings includes not adversely affecting adherence of the soldermask to the base.

21. The method of claim 19, wherein forming the plurality of openings includes forming a first plurality of openings to the region of the base and forming a second plurality of openings to the conductive layer.

22. The method of claim 19, wherein forming the second plurality of openings includes forming the second plurality of openings to both the conductive layer and the base.

23. A method of forming a circuit board, comprising:
providing a base having first and second regions;
forming conductive traces on the first region;
adhering a soldermask to the first and second regions;
forming openings in the soldermask over the first region to provide access to the conductive traces; and
forming vent holes in the soldermask to the second region so that gasses are vented from the base through the vent holes to prevent delamination of the soldermask from the base.

24. The method of claim 23, wherein providing the base includes providing the second region at outside edges of the base.

25. The method of claim 23, wherein adhering the soldermask includes screen printing the soldermask onto the first and second regions.

26. The method of claim 23, wherein adhering the soldermask includes forming the soldermask over the conductive trace.

27. A method of forming a circuit board, comprising:
providing a base having first and second regions;
forming conductive traces on the first region;
adhering a soldermask to the first and second regions;
forming openings in the soldermask over the first region to provide access to the conductive traces;
forming vent holes in the soldermask to the second region so that gasses are vented from the base through the vent holes to prevent delamination of the soldermask from the base; and
wherein forming vent holes includes maximizing surface area of the vent holes in locations not containing conductors.

28. A method of forming a circuit board, comprising:
providing a base having first and second regions;
forming conductive traces on the first region;
adhering a soldermask to the first and second regions;
forming openings in the soldermask over the first region to provide access to the conductive traces;
forming vent holes in the soldermask to the second region; and
expelling gasses through the vent holes without adversely affecting the adherence of the soldermask.

29. The method of claim 28, wherein providing the base includes providing the second region at outside edges of the base.

30. The method of claim 28, wherein adhering the soldermask includes screen printing the soldermask onto the first and second regions.

31. The method of claim 28, wherein adhering the soldermask includes forming the soldermask over the conductive trace.

32. The method of claim 28, wherein expelling gasses includes exposing the base to high temperature.

33. The method of claim 32, wherein expelling gasses includes expelling moisture retained by the soldermask or base.

34. A method of forming a circuit board, comprising:
providing a base having first and second regions;
forming conductive traces on the first region;
adhering a soldermask to the first and second regions;
forming openings in the soldermask over the first region to provide access to the conductive traces;
forming vent holes in the soldermask to the second region;
expelling gasses through the vent holes without adversely affecting the adherence of the soldermask; and
wherein forming vent holes includes maximizing surface area of the vent holes in locations not containing conductors.

* * * * *